United States Patent
Tzeng et al.

(10) Patent No.: US 7,907,412 B2
(45) Date of Patent: Mar. 15, 2011

(54) ELECTRONIC DEVICE WITH IMPROVED HEAT DISSIPATION PROPERTIES

(75) Inventors: Chinpyng J. Tzeng, Sunnyvale, CA (US); Nan-Sheng Lin, Fremont, CA (US); Shailesh Patel, Fremont, CA (US); Jose Alvarellos, Fremont, CA (US)

(73) Assignee: Innomedia Pte Ltd, Singapore (SG)

( * ) Notice: Subject to any disclaimer, the term of this patent is extended or adjusted under 35 U.S.C. 154(b) by 162 days.

(21) Appl. No.: 12/456,733

(22) Filed: Jun. 22, 2009

(65) Prior Publication Data

US 2010/0321898 A1 Dec. 23, 2010

(51) Int. Cl.
*H05K 7/20* (2006.01)
*F28F 7/00* (2006.01)
*H01L 23/34* (2006.01)

(52) U.S. Cl. ........ 361/715; 361/704; 361/709; 361/711; 361/719; 361/727; 165/80.1; 174/547; 174/252; 257/713

(58) Field of Classification Search ............. 361/679.54, 361/697, 703–704, 707, 709, 711, 715, 719; 165/80.1–80.5, 185; 174/547, 252; 257/712, 257/713, 721–722

See application file for complete search history.

(56) References Cited

U.S. PATENT DOCUMENTS

| 5,896,268 | A | * | 4/1999 | Beavers | 361/690 |
| 6,535,603 | B2 | * | 3/2003 | Laetsch | 379/338 |
| 6,798,878 | B2 | * | 9/2004 | Laetsch | 379/338 |
| 6,862,180 | B2 | * | 3/2005 | Sawyer et al. | 361/690 |
| 7,038,910 | B1 | * | 5/2006 | Hodge et al. | 361/690 |
| 7,269,895 | B2 | * | 9/2007 | Gustine et al. | 29/825 |
| 7,855,891 | B1 | * | 12/2010 | Ayres et al. | 361/711 |
| 2009/0290310 | A1 | * | 11/2009 | Kontani | 361/720 |

* cited by examiner

*Primary Examiner* — Zachary M Pape
(74) *Attorney, Agent, or Firm* — Timothy P. OHagan

(57) ABSTRACT

An electronic device with improved heat dissipation properties comprises metallic housing. A base circuit board may be positioned within the housing in a plane parallel to the backside. Multiple connectors for coupling cassettes to the base circuit board may be positioned about the periphery of the base circuit board such that multiple cassettes may be positioned adjacent to each side of the housing. Each cassette includes a printed circuit board with a plurality of heat generating components coupled to the printed circuit board and having a thickness extending towards the side of the housing. The cassette includes a metallic housing with a heat dissipation structure contacting: i) the side of the housing; and ii) each heat generating component. Each of at least two heat generating components have different thicknesses and the heat dissipation structure had different thicknesses between the side of the housing and each heat generating component.

17 Claims, 2 Drawing Sheets

ELECTRONIC DEVICE WITH IMPROVED HEAT DISSIPATION PROPERTIES

TECHNICAL FIELD

The present invention relates to an electronic device with a structure providing improved heat dissipation properties and more specifically, to an electronic device comprising heat generating electronics within a sealed enclosure with improved heat dissipation properties.

BACKGROUND OF THE INVENTION

For many years voice telephone service was implemented over a circuit switched network commonly known as the public switched telephone network (PSTN) and controlled by a local telephone service provider. In such systems, the analog electrical signals representing the conversation are transmitted between the two telephone handsets on a dedicated twisted-pair-copper-wire circuit. More specifically, each telephone handset is coupled to a local switching station on a dedicated pair of copper wires known as a subscriber loop. When a telephone call is placed, the circuit is completed by dynamically coupling each subscriber loop to a dedicated pair of copper wires between the two switching stations.

More recently voice telephone service has been implemented over the Internet utilizing technology commonly known as Voice-over-IP or VoIP. Typical architecture for implementing VoIP includes a cable modem or other Internet Service Provider (ISP) device capable or providing Internet service at a subscriber's premises. A client device of a VoIP service provider, typically known as a media terminal adapter (MTA) or "line card" is coupled to the ISP device via a network and utilizes internet protocols for communication with the VoIP service provider infrastructure and other VoIP endpoints over the Internet. The line card also emulates a central office switch to support use of regular PSTN telephone handsets coupled to the premises twisted pair network may be used for initiating and terminating VoIP telephone calls.

Digital signal processing circuitry within the line card interfaces between the PSTN analog audio signals used for supporting operation of the PSTN telephone handset and both signaling messages exchanged with the VoIP service provider infrastructure and compressed digital audio frames exchanged with the remote VoIP endpoint over the Internet.

A common structure for enclosing multiple line cards (for supporting multiple PSTN lines) includes use of parallel "plug in" cards within a framed chassis. A problem associated with use of parallel "plug-in" cards for VoIP "line cards" is that the digital signal processing circuitry on a line card generates a significant amount of heat. In an environment where it is desirable to position multiple line cards outside of the subscriber premises, the line cards and associated systems must be housed within a sealed enclosure for protection against weather. This creates a situation where heat generated within the enclosure can exceed the operating limits of the electronic components of the line cards.

What is needed is a structure which provides improved heat dissipation properties and more specifically, to an electronic device comprising heat generating electronics populated on multiple circuit board "cards" within a sealed enclosure structure with improved heat dissipation properties.

SUMMARY OF THE INVENTION

In a first aspect, the present invention comprises an electronic device with improved heat dissipation properties. The device includes a box shaped housing comprising a backside defining a backside plane and at least a first side and a second side, each orthogonal to the backside. An exterior of the box is exposed to ambient environmental temperature.

A base circuit board is positioned within the box shaped housing in a plane parallel to the backside plane and orthogonal to each of the housing first (right) side and housing second (left) side.

In this first aspect, a plurality of cassettes are each coupled to the base circuit board by a cassette connector. Each cassette is adjacent to, and in contact with, one of the first side of the housing and the second side of the housing. The plurality of cassettes include at least a first cassette coupled adjacent to the first side of the housing.

Each of the plurality of cassettes comprises a cassette printed circuit board in a plane which is parallel to the side to which the cassette is adjacent and is orthogonal to the base circuit board.

Coupled to the cassette printed circuit board are at least a first heat generating component, a second heat generating component, and a third heat generating component. The first heat generating component has a first thickness extending from the cassette printed circuit board towards the side to which the cassette is adjacent, the second heat generating component has a second thickness extending from the cassette printed circuit board towards the side to which the cassette is adjacent, and the third heat generating component has a third thickness extending from the cassette printed circuit board towards the side to which the cassette is adjacent. Each of the first, second, and third thicknesses are different and at least the second thickness is less than the first thickness. Each cassette printed circuit board may be the same—with the same components populated in the same positions on each board.

Each cassette further includes a cassette heat dissipation structure positioned between the cassette printed circuit board and the side to which the cassette is adjacent. The cassette heat dissipation structure contacts each of: i) the side to which the cassette is adjacent; ii) the first heat generating component; and iii) the second heat generating component. Each head dissipation structure of each cassette may be the same.

The cassette heat dissipation structure of each cassette may be a metallic body comprising: i) a cassette heat transfer contact plane in contact with the side of the housing to which the cassette is adjacent; ii) a first component heat transfer contact plane in contact with the first heat generating component; iii) a second component heat transfer contact plane in contact with the second heat generating component; and iv) a third component heat transfer contact plane in contact with the third heat generating component.

In sub embodiments, the plurality of cassettes further comprise multiple other cassettes coupled adjacent to both the first side of the housing and the second side of the housing.

In a second aspect, the present invention also comprises an electronic device with improved heat dissipation properties. The device comprises a metallic box housing comprising a backside defining a backside plane and at least a first (right) housing side orthogonal to (i.e. perpendicular to and intersecting) the backside.

The metallic box shaped housing may further comprise a second (left) housing side, a housing top, and a housing bottom. Each of the housing first side, the housing second side, the housing top, and the housing bottom are orthogonal to the back side plane—thereby forming a generally rectangular boxed shaped enclosure.

The generally rectangular boxed shaped enclosure includes: i) the housing first side generally parallel to the housing second side; ii) the housing top generally parallel to the housing bottom; and iii) each of the housing top and housing bottom generally orthogonal to each of the housing first side and housing second side.

A base circuit board may be positioned within the box housing in a plane parallel to the backside plane and perpendicular each of the housing first side and housing second side. Multiple connectors for coupling cassettes to the base circuit board may be positioned about the periphery of the base circuit board such that multiple cassettes may be positioned adjacent to the first housing side and multiple cassettes may be positioned adjacent to the second housing side.

The cassettes may include a first cassette coupled to the base circuit board by a first cassette connector. The first cassette may be adjacent to, and in contact with, the first side of the housing. The first cassette comprises a cassette printed circuit board (i.e. a first cassette printed circuit board) in a plane parallel to the first side plane and orthogonal to the base circuit board and may include each of a first heat generating component, a second heat generating component and a third heat generating component coupled thereto.

The first heat generating component may have a first thickness extending from the first cassette printed circuit board towards the housing first side, the second heat generating component may have a second thickness extending from the first cassette printed circuit board towards the housing first side, and the third heat generating component may have a third thickness extending from the first cassette printed circuit board towards the housing first side. Each of the first thickness, second thickness, and third thickness may be different with the second thickness being less than the first thickness.

The cassettes may further include a second cassette coupled to the base circuit board adjacent to the first cassette—and adjacent to and in contact with the first side. The second cassette may include the same structure as the first cassette. More specifically, the second cassette may comprise a second cassette printed circuit board in a plane parallel to the housing first side and perpendicular to the base circuit board and may include the same heat generating components coupled thereto.

The cassettes may further include a third cassette coupled to the base circuit board adjacent to and in contact with the second side. The third cassette may also include the same structure as the first cassette. More specifically, the third cassette may comprise a third cassette printed circuit board in a plane parallel to the housing first side and perpendicular to the base circuit board and may include the same heat generating components coupled thereto—and extending towards the second side.

Each cassette includes a metallic housing. The metallic housing includes at least a heat dissipation structure positioned between the cassette printed circuit board and the housing side (the first housing side or the second housing side). The cassette heat dissipation structure contacts the housing side, the first heat generating component, the second heat generating component, and the third heat generating component.

More specifically, the heat dissipation structure may comprise: i) a cassette heat transfer contact plane in contact with the housing side; ii) a first component heat transfer contact plane in contact with the first heat generating component; iii) a second component heat transfer contact plane in contact with the second heat generating component; and iv) a third component heat transfer contact plane in contact with the third heat generating component.

A third aspect of the present invention further includes an electronic device with improved heat dissipation properties. In this third aspect, the device comprises a box shaped housing with a backside defining a backside plane and at least a first side and a second side, each orthogonal to the backside.

A base circuit board is positioned within the box housing in a plane parallel to the backside plane and orthogonal to each of the housing first side and housing second side.

The device includes at least one printed circuit board. The at least one printed circuit board (or each of the at least one printed circuit boards if there are more than one) is (are) coupled to the base circuit board by a connector and is (are) adjacent to one of the first side of the housing and the second side of the housing.

The first of the printed circuit boards (i.e. a first printed circuit board) is coupled adjacent to the first side of the housing and in a plane parallel to the first side of the housing and orthogonal to the base circuit board.

Optionally: i) a second of the printed circuit boards (i.e. a second printed circuit board) may be coupled adjacent to the first side of the housing; ii) a third of the printed circuit boards (i.e. a third printed circuit board) may be coupled adjacent to the second side of the housing; and iii) yet additional printed circuit boards may be coupled adjacent to either the first side or the second side of the housing.

Each of the printed circuit boards comprises at least a first heat generating component, a second heat generating component, and a heat dissipation structure. The first heat generating component may be coupled to the printed circuit board and have a first thickness extending from the printed circuit board towards the side of the housing to which the printed circuit board is adjacent. The second heat generating component may also be coupled to the printed circuit board and have a second thickness extending from the printed circuit board towards the side of the housing to which the printed circuit board is adjacent. The second thickness is different than the first thickness and may be less than the first thickness.

The heat dissipation structure is positioned between the printed circuit board and the side of the housing to which the printed circuit board is adjacent. The heat dissipation structure contacts each of: i) the side of the housing to which the printed circuit board is adjacent; ii) the first heat generating component; and iii) the second heat generating component.

The heat dissipation structure may comprises a metallic body with: i) a heat transfer contact plane in contact with the side to which the printed circuit board is adjacent; ii) a first component heat transfer contact plane in contact with the first heat generating component; and iii) a second component heat transfer contact plane in contact with the second heat generating component.

For a better understanding of the present invention, together with other and further aspects thereof, reference is made to the following description, taken in conjunction with the accompanying drawings. The scope of the present invention is set forth in the appended claims.

DETAILED DESCRIPTION OF THE EXEMPLARY EMBODIMENTS

Figure 1:
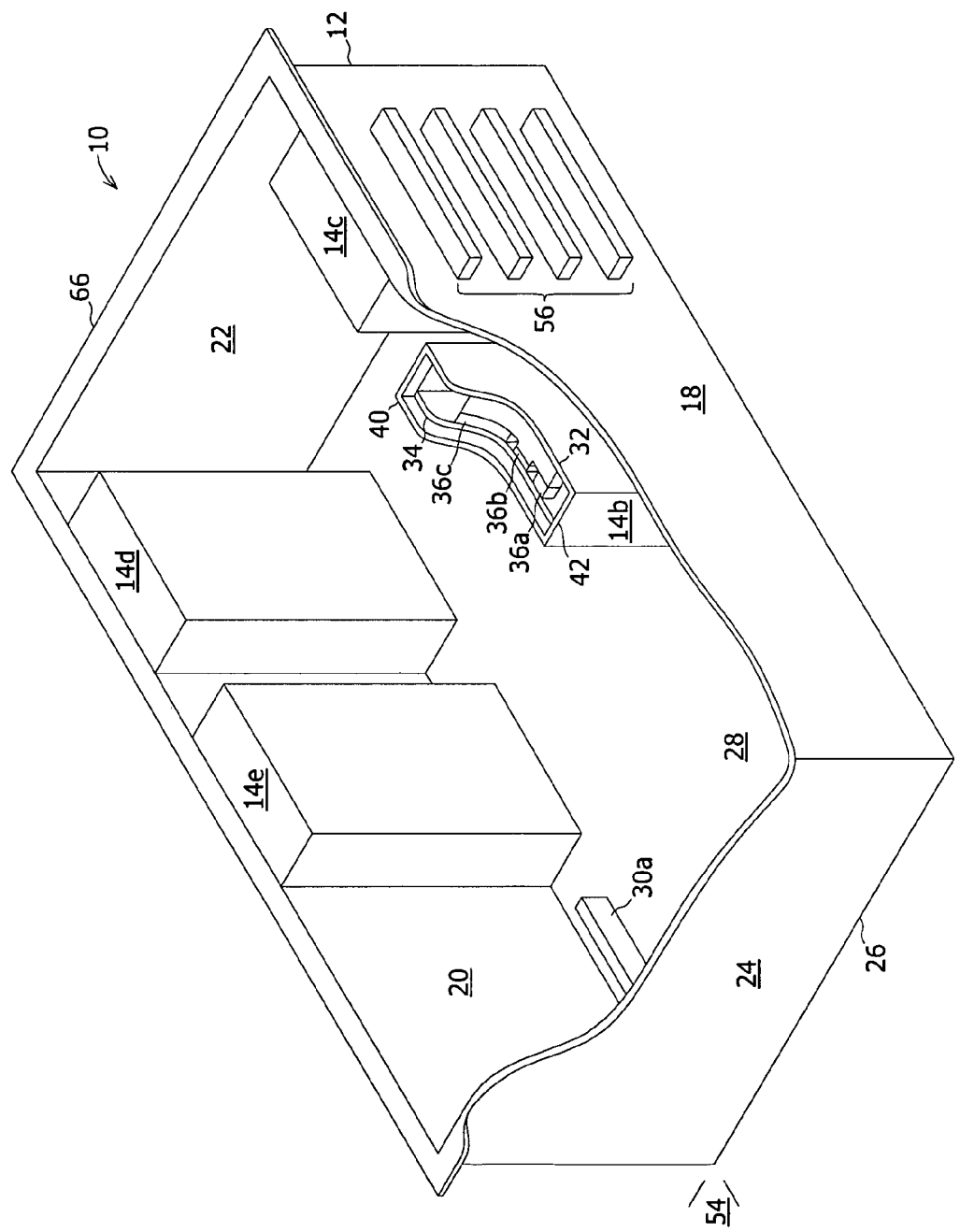
FIG. 1 is a perspective diagram, in partial cut away, of an electronic device with improved heat dissipation properties in accordance with an embodiment of the present invention.

The present invention will now be described in detail with reference to the drawings. In the drawings, each element with a reference number is similar to other elements with the same reference number independent of any letter designation following the reference number. In the text, a reference number with a specific letter designation following the reference number refers to the specific element with the number and letter designation and a reference number without a specific letter designation refers to all elements with the same reference number independent of any letter designation following the reference number in the drawings.

It should also be appreciated that many of the elements discussed in this specification may be implemented in a hardware circuit(s), a processor executing software code, or a combination of a hardware circuit(s) and a processor or control block of an integrated circuit executing machine readable code. As such, the term circuit, module, server, or other equivalent description of an element as used throughout this specification is intended to encompass a hardware circuit (whether discrete elements or an integrated circuit block), a processor or control block executing code, or a combination of a hardware circuit(s) and a processor and/or control block executing code.

FIG. 1 depicts an electronic device 10 with improved heat dissipation properties. The device comprises a metallic box housing 12 with a generally planar backside 26 within or defining a backside plane 54.

The box housing 12 further comprises: i) a generally planar first (right) side 18 orthogonal to the backside 26; ii) a generally planar second (left) side 20 parallel to the first side 18 and orthogonal to the backside 26; iii) a generally planar top 22 orthogonal to each of the backside 26, the first side 18 and the second side 20; and iv) a generally planar bottom 24 parallel to the top 22 and also orthogonal to each of the backside 26, the first side 18 and the second side 20.

The term "orthogonal" as used in the preceding paragraph means the elements are perpendicular to each other and adhered to each other at a linear intersection. The four lines defined by the intersection of the backside 26 with each of the first side 18, top 22, left side 20, and bottom 24 generally form a square or rectangle and the backside 26 being adhered to each of the first side 18, top 22, left side 20, and bottom 24 the four lines generally form a sealed box shaped enclosure with an open face.

The box shaped enclosure 12 further includes a flange 66 extending around the perimeter of the open face of the enclosure 12 defined by the first side 18, the second side 20, the top 22 and the bottom 24. The flange 66 is for securing a face plate 68 (not shown) to the flange 66 and completely sealing the enclosure 12.

The box housing 12 may be fabricated of a metal such as aluminum or an aluminum compound which both resist corrosion when exposed to moisture in an outdoor environment and has a very high heat transfer coefficient indicating rapid thermal conductivity.

Figure 3:
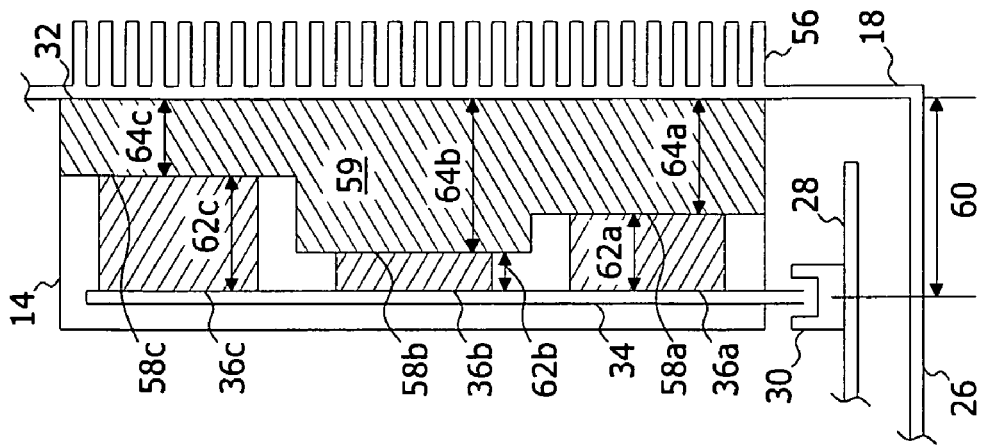
FIG. 3 is a cut away view of a cassette positioned within an enclosure in accordance with an embodiment of the present invention.

The box housing may also include an array of cooling fins 56 on one or more of the first side 18, the second side 20, the top 22 and the bottom 24. For simplicity, FIG. 1 depicts the array of cooling fins 56 on only a portion of the first side 18, however substantially more cooling fins (as depicted in FIG. 3) on each surface are envisioned to improve dissipation of heat generated by components within the box housing 12.

Figure 2:
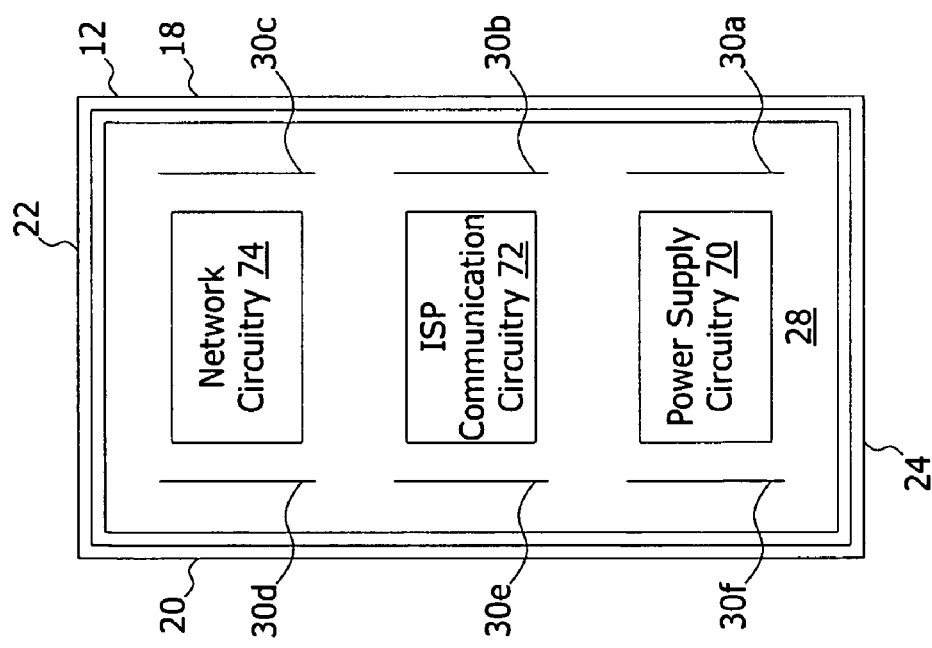
FIG. 2 is a front view of an electronic device with improved heat dissipation properties in accordance with an embodiment of the present invention.

Turning briefly to FIG. 2 in conjunction with FIG. 1, a base circuit board 28 may be positioned within the box housing 12 in a plane generally parallel to the backside plane 54. The base circuit board 28 generally extends between the first side 18 and the second side 20—and further generally extends between the top 22 and the bottom 24.

The base circuit board 28 may include multiple cassettes connectors 30a-30f positioned adjacent to the sides 18 and 20. Each cassette connector 30a-30f may couple a single cassette 14 to the base circuit board 28. For clarity, FIG. 1 depicts cassettes 14b, 14c, 14d and 14e coupled to connectors 30b, 30c, 30d, and 30e respectively. Connectors 30a and 30f remain exposed and available for coupling additional cassettes to the base circuit board 28. As noted, with cassettes along multiple sides of the housing, the term positioned adjacent to a side indicates that it is closer to, or in contact with, the side to which it is adjacent.

In one exemplary embodiment, the electronic device 10 with improved heat dissipation properties is used for providing voice-over IP telephone service to a subscriber's premises. In this embodiment, each cassette 14 comprises circuitry commonly known as a media terminal adapter (MTA) or "line-card" for supporting a PSTN Line within the subscriber premises. More particularly, each cassette 14 includes electronic components which: i) utilize internet protocols for communication with the VoIP service provider infrastructure and other VoIP endpoints; and ii) emulates a central office switch to support use of regular PSTN telephone handsets coupled to the premises twisted pair networks may be used for initiating and terminating VoIP telephone calls.

In this embodiment, the base circuit board 28 may include: i) power supply circuitry for converting line power to applicable power for operating the electronic systems of the electronic device 10 (power supply circuitry 70); ii) circuitry commonly known as modem circuitry for establishing communication with an Internet Service Provider (ISP) system which enables IP communication with other internet endpoints (ISP circuitry 72); and iii) network circuitry which may function to manage a local area network such as Ethernet between the ISP communication circuitry 72 and MTA systems on each cassette 14.

Turning to FIG. 3, a cassette 14 is depicted coupled to a connector 30 such that the cassette 14 is positioned adjacent to side 18 of the housing 12 and is representative of the structure by which each connector 30b-30e (FIG. 2) couple couples a cassette 14b-14e to the base circuit board 28 adjacent to, and contacting, one of the sides 18 or 20 as depicted on both FIG. 1 and FIG. 3. FIG. 3 further depicts structure of cassette 14 which is representative of the structure of each cassette 14b-14e that may be coupled to one of the connectors 30 as depicted in FIG. 1.

Referring to FIG. 3 in conjunction with FIG. 1, the cassette 14 (again, representative of each cassette 14b-14e) comprises a generally planar printed circuit board 34. When the cassette 14 is secured to the connector 30, the printed circuit board 34 is electronically coupled to the base circuit board 28 via the connector 30. Further, when the cassette 14 is secured to the connector 30, the printed circuit board 34 is generally parallel to each of the sides 18 and 20 while being generally perpendicular to the backside 26 and each of the top 22 and bottom 24.

Secured to the printed circuit board 34 are a plurality of heat generating electronic components 36a-36c such as integrated circuit chips (processors, digital signal processors, ASIC, ect) implementing the MTA systems of the cassette 14 which generate significant heat when operating.

It is envisioned that the first heat generating component 36a may have a first thickness 62a extending from the printed circuit board 34 towards the housing first side 18. The second heat generating component 36b may have a second thickness 62b extending from the printed circuit board 34 towards the housing first side 18. The third heat generating component 36c may have a third thickness 62c extending from the printed circuit board 34 towards the housing first side 18. Each of the first thickness 62a, the second thickness 62b, and the third thickness 62c may be different thicknesses. It should be appreciated that for each cassette 14 (for example cassette 14d and 14e) positioned adjacent to the second side 20, each component 36a, 36b and 36c extend form the printed circuit board 34 towards the second side Each cassette 14 further includes a heat dissipation structure 59 positioned between the printed circuit board 34 and the first side 18 (or the second side when the cassette is positioned adjacent to the second side 20). More specifically, the heat dissipation structure 59 may include a cassette heat transfer contact plane 32 in contact with the housing first side 18 (or the second side when the cassette is positioned adjacent to the second side 20), a first component heat transfer contact plane 58a in contact with the first heat generating component 36a, a second component heat transfer contact plane 58b in contact with the second heat generating component 36b, and a third component heat transfer contact plane 58c in contact with the second heat generating component 36c. The heat dissipation structure 59 may be a solid structure between the heat transfer contact plane 32 and each of the first component heat transfer contact plane 58a, the second component heat transfer contact plane 58b, and the third component heat transfer contact plane 58c. The solid structure may be fabricated of a metal such as aluminum or an aluminum compound which has a very high heat transfer coefficient indicating rapid thermal conductivity. As such, heat generated by each component 36a, 36b, 36c may be efficiently absorbed by the heat dissipation structure 59 at each heat transfer contact plane 58a, 58b, 58c respectively, conducted through the solid structure, and then absorbed by the housing 12 through the cassette transfer contact plane 32.

For more specifically stating this structure, a dimension 60 between the printed circuit board 34 and the first side 18 (or the second side 20 when the cassette 14 is adjacent to the second side 20) is equal to: i) with respect to the first heat generating component 36a, the first thickness 62a combined with (i.e. added to) a first thickness 64a of the heat dissipation structure 59 between the first component heat transfer contact plane 58a and the cassette heat transfer contact plane 32; ii) with respect to the second heat generating component 36a, the second thickness 62b combined with a second thickness 64b of the heat dissipation structure 59 between the second component heat transfer contact plane 58b and the cassette heat transfer contact plane 32; and iii) with respect to the third heat generating component 36c, the third thickness 62c combined with a third thickness 64c of the heat dissipation structure 59 between the third component heat transfer contact plane 58c and the cassette heat transfer contact plane 32.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. An electronic device with improved heat dissipation properties comprising:
   a housing comprising a backside defining a backside plane and at least a first side orthogonal to the backside;
   a base circuit board positioned within the housing in a plane parallel to the backside plane and orthogonal to each of the housing first side and housing second side;
   a first cassette coupled to the base circuit board by a first cassette connector, the first cassette comprising:
   a first cassette printed circuit board in a plane parallel to the first side plane and orthogonal to the base circuit board;
   a first heat generating component coupled to the first cassette printed circuit board, the first heat generating component having a first thickness extending from the first cassette printed circuit board towards the housing first side;
   a second heat generating component coupled to the first cassette printed circuit board, the second heat generating component having a second thickness extending from the first cassette printed circuit board towards the housing first side, the second thickness being less than the first thickness; and
   a first cassette heat dissipation structure positioned between the first cassette printed circuit board and the housing first side, the first cassette heat dissipation side contacting each of the housing first side, the first heat generating component, and the second heat generating component.

2. The device of claim 1, wherein the first cassette heat dissipation structure comprises a metallic body comprising:
   a cassette heat transfer contact plane in contact with the housing first side;
   a first component heat transfer contact plane in contact with the first heat generating component; and
   a second component heat transfer contact plane in contact with the second heat generating component.

3. The device of claim 1, further comprising:
   a second cassette coupled to the base circuit board by a second cassette connector, the second cassette comprising:
   a second cassette printed circuit board in a plane parallel to the housing first side and orthogonal to the base circuit board;
   a first heat generating component coupled to the second cassette printed circuit board, the first heat generating component having the first thickness extending from the second cassette printed circuit board towards the housing first side;
   a second heat generating component coupled to the second cassette printed circuit board, the second heat generating component having the second thickness extending from the second cassette printed circuit board towards the housing first side;
   a second cassette heat dissipation structure positioned between the second cassette printed circuit board and the housing first side, the second cassette heat dissipation side contacting each of the housing first side, the first heat generating component, and the second heat generating component.

4. The device of claim 3, wherein:
   the first cassette heat dissipation structure comprises a metallic body comprising:
   a cassette heat transfer contact plane in contact with the housing first side;

a first component heat transfer contact plane in contact with the first heat generating component of the first cassette; and a second component heat transfer contact plane in contact with the second heat generating component of the first cassette; and the second cassette heat dissipation structure comprises a metallic body comprising:

a cassette heat transfer contact plane in contact with the housing second side;

a first component heat transfer contact plane in contact with the first heat generating component of the second cassette; and a second component heat transfer contact plane in contact with the second heat generating component of the second cassette.

5. The device of claim 3, wherein:

the housing further comprises a second housing side, a housing top, and a housing bottom;

each of the housing first side, the housing second side, the housing top, and the housing bottom are orthogonal to the back side plane;

the housing first side is parallel to the housing second side;

the housing top is parallel to the housing bottom; and each of the housing top and housing bottom are orthogonal to each of the housing first side and housing second side.

6. The device of claim 5, further comprising:

a third cassette coupled to the base circuit board by a third cassette connector, the third cassette comprising:

a third cassette printed circuit board in a plane parallel to the housing second side and orthogonal to the base circuit board;

a first heat generating component coupled to the third cassette printed circuit board, the first heat generating component having the first thickness extending from the third cassette printed circuit board towards the housing second side;

a second heat generating component coupled to the third cassette printed circuit board, the second heat generating component having the second thickness extending from the third cassette printed circuit board towards the housing second side; and a third cassette heat dissipation structure positioned between the third cassette printed circuit board and the housing second side, the third cassette heat dissipation side contacting each of the housing second side, the first heat generating component, and the second heat generating component.

7. The device of claim 6, wherein:

the first cassette heat dissipation structure comprises a metallic body comprising:

a cassette heat transfer contact plane in contact with the housing first side;

a first component heat transfer contact plane in contact with the first heat generating component of the first cassette; and a second component heat transfer contact plane in contact with the second heat generating component of the first cassette;

the second cassette heat dissipation structure comprises a metallic body comprising:

a cassette heat transfer contact plane in contact with the housing first side;

a first component heat transfer contact plane in contact with the first heat generating component of the second cassette; and a third component heat transfer contact plane in contact with the second heat generating component of the second cassette; and the third cassette heat dissipation structure comprises a metallic body comprising:

a cassette heat transfer contact plane in contact with the housing second side;

a first component heat transfer contact plane in contact with the first heat generating component of the third cassette; and a second component heat transfer contact plane in contact with the second heat generating component of the third cassette.

8. An electronic device with improved heat dissipation properties comprising:

a housing comprising a backside defining a backside plane and at least a first side and a second side, each orthogonal to the backside;

a base circuit board positioned within the housing in a plane parallel to the backside plane and orthogonal to each of the housing first side and housing second side;

a plurality of cassettes, each coupled to the base circuit board by a cassette connector and each being adjacent to one of the first side of the housing and the second side of the housing, the plurality of cassettes comprising at least a first cassette coupled adjacent to the first side of the housing;

each of the plurality of cassettes comprising:

a cassette printed circuit board in a plane parallel to the side to which the cassette is adjacent and orthogonal to the base circuit board;

a first heat generating component coupled to the cassette printed circuit board, the first heat generating component having a first thickness extending from the cassette printed circuit board towards the side to which the cassette is adjacent;

a second heat generating component coupled to the cassette printed circuit board, the second heat generating component having a second thickness extending from the first cassette printed circuit board towards the side to which the cassette is adjacent, the second thickness being less than the first thickness; and a cassette heat dissipation structure positioned between the cassette printed circuit board and the side to which the cassette is adjacent, the cassette heat dissipation structure contacting each of the side of the housing to which the cassette is adjacent, the first heat generating component, and the second heat generating component.

9. The device of claim 8, wherein the cassette heat dissipation structure of each cassette comprises a metallic body comprising:

a cassette heat transfer contact plane in contact with the side to which the cassette is adjacent;

a first component heat transfer contact plane in contact with the first heat generating component; and a second component heat transfer contact plane in contact with the second heat generating component.

10. The device of claim 8, wherein the plurality of cassettes further comprise at least a second cassette coupled adjacent to the first side of the housing.

11. The device of claim 8, wherein the plurality of cassettes further comprise at least a third cassette coupled adjacent to the second side of the housing.

12. The device of claim 11, wherein the cassette heat dissipation structure of each cassette comprises a metallic body comprising:
- a cassette heat transfer contact plane in contact with the side to which the cassette is adjacent;
- a first component heat transfer contact plane in contact with the first heat generating component; and
- a second component heat transfer contact plane in contact with the second heat generating component.

13. An electronic device with improved heat dissipation properties comprising:
- a housing comprising a backside defining a backside plane and at least a first side and a second side, each orthogonal to the backside;
- a base circuit board positioned within the housing in a plane parallel to the backside plane and orthogonal to each of the housing first side and housing second side;
- at least one printed circuit board, each of the at least one printed circuit boards being coupled to the base circuit board by a connector and each being adjacent to one of the first side of the housing and the second side of the housing, each of the at least one printed circuit boards including a first printed circuit board coupled adjacent to the first side of the housing and in a plane parallel to the first side of the housing and orthogonal to the base circuit board, each of the at least one printed circuit boards comprising:
  - a first heat generating component coupled to the printed circuit board, the first heat generating component having a first thickness extending from the printed circuit board towards the side of the housing to which the printed circuit board is adjacent;
  - a second heat generating component coupled to the printed circuit board, the second heat generating component having a second thickness extending from the printed circuit board towards the side of the housing to which the printed circuit board is adjacent, the second thickness being less than the first thickness; and
  - a heat dissipation structure positioned between the printed circuit board and the side of the housing to which the printed circuit board is adjacent, the heat dissipation structure contacting each of the side of the housing to which the printed circuit board is adjacent, the first heat generating component, and the second heat generating component.

14. The device of claim 13, wherein the heat dissipation structure comprises a metallic body comprising:
- a heat transfer contact plane in contact with the side to which the printed circuit board is adjacent;
- a first component heat transfer contact plane in contact with the first heat generating component; and
- a second component heat transfer contact plane in contact with the second heat generating component.

15. The device of claim 13, wherein the device further includes a second printed circuit board, the second printed circuit board being one of the at least one printed circuit boards coupled to the base circuit board by a connector and each being adjacent to one of the first side of the housing and the second side of the housing, the second printed circuit board being coupled adjacent to the first side of the housing.

16. The device of claim 15, wherein the device further includes a third printed circuit board, the third printed circuit board further being one of the at least one printed circuit boards coupled to the base circuit board by a connector and each being adjacent to one of the first side of the housing and the second side of the housing, the third printed circuit board being coupled adjacent to the second side of the housing.

17. The device of claim 16, wherein the heat dissipation structure of each printed circuit board comprises a metallic body comprising:
- a cassette heat transfer contact plane in contact with the side to which the printed circuit board is adjacent;
- a first component heat transfer contact plane in contact with the first heat generating component; and
- a second component heat transfer contact plane in contact with the second heat generating component.

* * * * *